(12) United States Patent
McBride

(10) Patent No.: US 6,910,193 B1
(45) Date of Patent: Jun. 21, 2005

(54) SYSTEM AND METHOD FOR EXECUTING TESTS ON AN INTEGRATED CIRCUIT DESIGN

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/273,820

(22) Filed: Mar. 22, 1999

(51) Int. Cl.[7] .............................................. G06F 17/50
(52) U.S. Cl. .............................................. 716/4; 716/5
(58) Field of Search ........................ 716/4, 5; 703/22; 707/8

(56) References Cited

U.S. PATENT DOCUMENTS

| | | | |
|---|---|---|---|
| 6,053,947 A | | 4/2000 | Parson ........................ 703/14 |
| 6,094,654 A | * | 7/2000 | Van Huben ..................... 707/8 |

OTHER PUBLICATIONS

Microsoft, "Microsoft Press Computer Dictionary, 3rd Ed.", 1997. pp. 96, 148, 194, 415, and 441.*

Microsoft, "Microsoft Press Computer Dictionary, 3rd Ed.", 1997. pp. 96, 148, 194, 415, and 441.*

* cited by examiner

Primary Examiner—Stacy A. Whitmore

(57) ABSTRACT

The present invention is generally directed to a system and method for performing evaluation tests on a circuit design. Specifically, the present invention is directed to a system and method that controllably executes test routines on a netlist file. Broadly, the system of the present invention is a software package that is configured to execute a wide variety of tests, checks, or evaluations on a circuit design, as defined by a netlist file. An inventive aspect lies in the controllable execution of the various tests, checks, and evaluations, whereby certain tests may be omitted. In accordance with this novel aspect of the invention, the program may look to one or more files that contain a listing of tests that would otherwise be performed by the program, but which the program omits if listed in any of the one or more exclusion files. Preferably, the system employs two such exclusion files: one which is located in a "local" directory (i.e., the same location from which the program is being launched), and a "global" exclusion file, which is located in a predetermined, or specified, location.

12 Claims, 8 Drawing Sheets

SYSTEM AND METHOD FOR EXECUTING TESTS ON AN INTEGRATED CIRCUIT DESIGN

BACKGROUND OF THE INVENTION

1. Field of the Invention

The present invention generally relates to computer-aided circuit design systems, and more particularly to a system and method for executing tests on an integrated circuit design.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using Boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify a wide variety of other potential problems within a circuit. For example, it may be desirable to evaluate a circuit design to identify nodes that may be subject to a charge sharing effect, to identify an excessive number of series-connected pass FETs, to identify feedback on a dynamic gate that exceeds a predetermined amount, to identify feedback on a latch gate that exceeds a predetermined amount, as well as a number of additional configurations.

Whether providing a system and/or method that achieves this added functionality, it may be desirable to provide such a system that operates in a highly robust and user-controllable fashion. For example, if the system is configured to execute a relatively large number of tests, it may be desirable to control the manner in which tests are executed.

Accordingly, there is a heretofore unaddressed need to provide a design tool that evaluates a netlist or other electronic file representative of an electronic circuit to perform a series of tests in a highly controllable manner.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for performing evaluation tests on a circuit design. Specifically, the present invention is directed to a system and method that controllably executes test routines on a netlist file. Broadly, the system of the present invention is a software package that is configured to execute a wide variety of tests, checks, or evaluations on a circuit design, as defined by a netlist file. An inventive aspect lies in the controllable execution of the various tests, checks, and evaluations, whereby certain tests may be omitted. In accordance with this novel aspect of the invention, the program may look to one or more files that contain a listing of tests that would otherwise be performed by the program, but which the program omits if listed in any of the one or more exclusion files. Preferably, the system employs two such exclusion files: one which is located in a "local" directory (i.e., the same location from which the program is being launched), and a "global" exclusion file, which is located in a predetermined, or specified, location.

In accordance with one aspect of the present invention, a method is provided for performing design tests on a circuit design, by evaluating a netlist file. In accordance with this aspect, the method evaluates both a first and second file, each of which identifies at least one test that is to be excluded from a list of predefined tests to be executed by the method. The method then executes a plurality of predefined tests, excluding those tests that are identified in either the first file or the second file. It is contemplated that the first file may be created by, for example, a design engineer who may wish to perform various interim evaluations of the circuit design, during a design phase. In accordance with such a design methodology, the design engineer may often wish to exclude a large number of time consuming tests that are otherwise predefined to execute by the program. Accordingly, this first file may be located in a "local directory," which may be at the same directory location from where the program is launched. The second file may be located at a different location in the directory (or network) structure, and may be created and/or configured by, for example, a project manager or a lead project engineer. If, for example, there are certain tests that are not needed to be run for a given circuit or project (based upon the design constraints or specifications for the project), then such tests may be identified in a second file located in another, predefined location. It will be appreciated that, consistent with the concepts of the present invention, the first and second files may be configured to affirmatively define those tests that are to be executed, as opposed to those tests that are to be excluded.

In accordance with another aspect of the present invention, a system is provided for performing design tests on a circuit design by evaluating a netlist file. The system constructed in accordance with this aspect of the invention includes a first file stored at a first location, wherein the first file identifies at least one test. Similarly, the system includes a second file stored at a second location, wherein the second file identifies at least one test. Finally, the system includes a program for executing a plurality of predefined tests, wherein the program is configured to exclude from execution those tests that are identified in either the first file or the second file. Like the method described above, however, the first and second files may be configured to affirmatively define those tests that are to be executed, as opposed to those tests that are to be excluded.

In accordance with a similar aspect of the present invention, a computer readable storage medium is provided having program code for performing tests on a circuit design, by evaluating a netlist file that defines the circuit design. To carry out this aspect of the invention, the computer readable storage medium may contain a first code segment configured to evaluate a first file that identifies at least one test. Similarly, the computer readable storage medium may contain a second code segment that is configured to evaluate a second file that identifies at least one test. Finally, the computer readable storage medium may include a third code segment that is configured to execute a plurality of predefined tests. However, the third code segment may be configured to exclude from execution those tests that are identified in either the first file or the second file.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
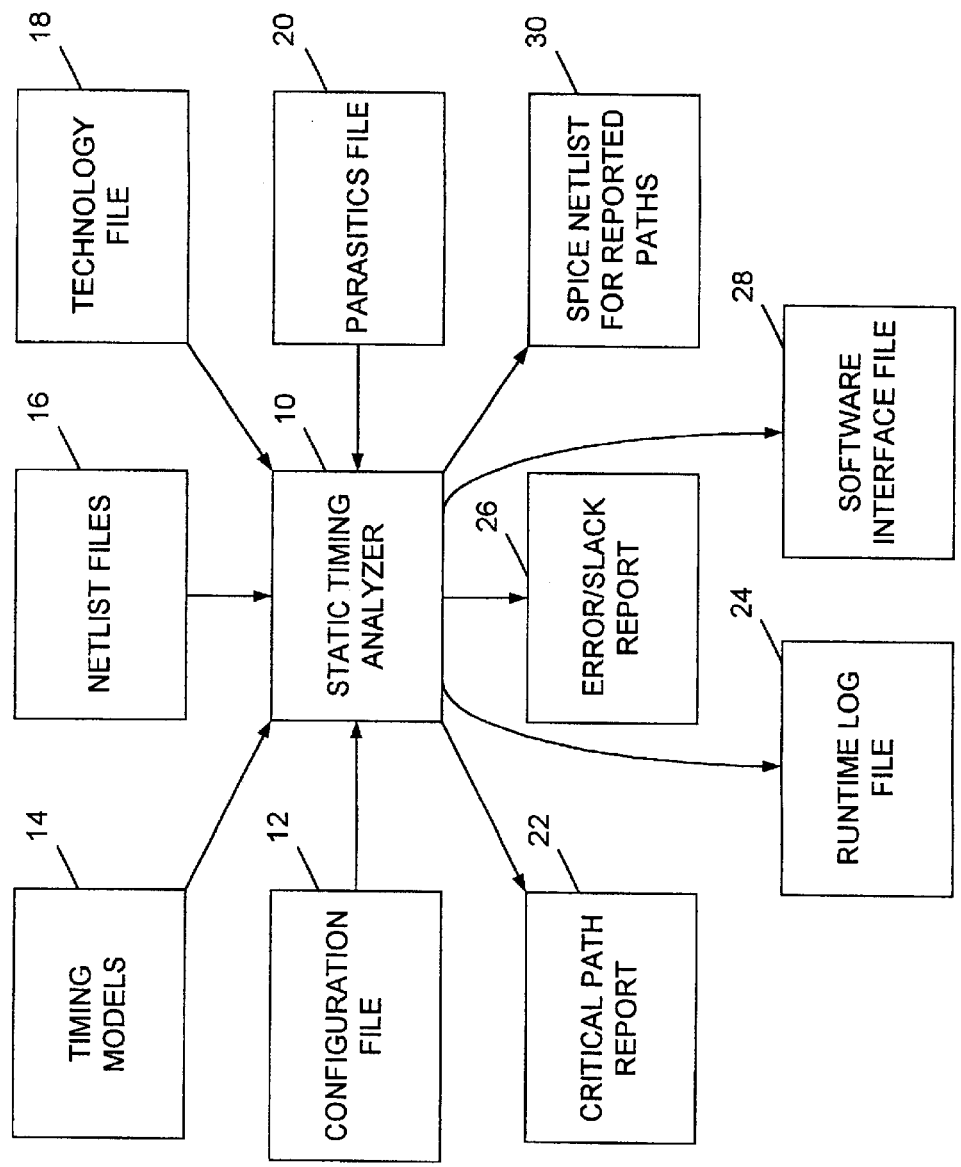
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations. The static timing analyzer 10 may make its internal database or netlist available to the electrical rules checker and may generate a binary file output 106.

The electrical rules checker 100 program of the present invention is preferably configured to operate on an output of the static timing analyzer 10. In this regard, the static timing analyzer may be configured to generate an output netlist database, which the electrical rules checker of the present invention may utilize as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

Figure 2:
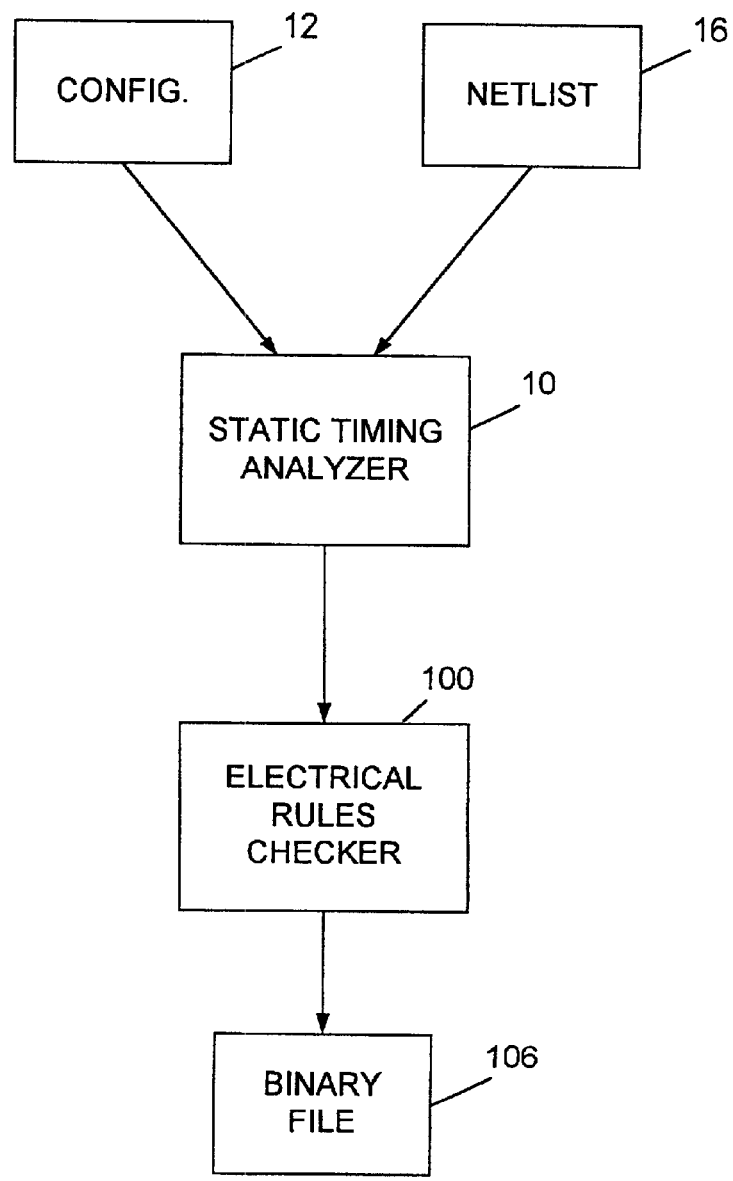
FIG. 2 is a block diagram illustrating the orientation of the electrical rules checking program of the preferred embodiment, in relation to an existing static timing analyzer.

In keeping with the description of FIG. 2, the electrical rules checker 100 of the present invention may generate an output binary file 106, which may ultimately be used in subsequent executions of the electrical rules checker program 100. Having described certain fundamental environmental and background system information, the discussion will now provide additional environmental information directed toward the preferred embodiment of the present invention. In this regard, a fundamental aspect of the present invention is to provide a comprehensive electrical rules checker 100 that is readily configurable to exclude the execution of various tests.

Figure 3:
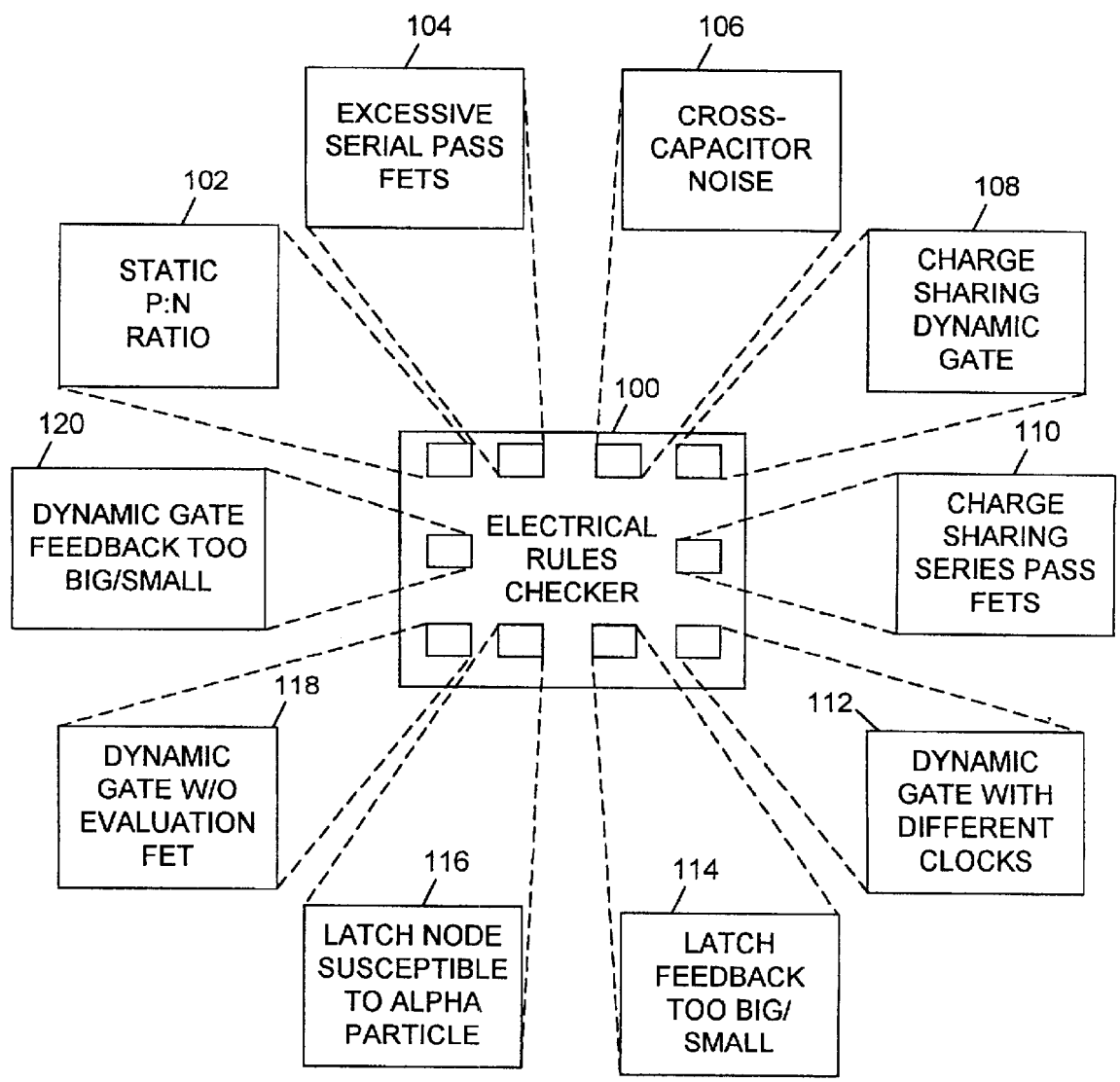
FIG. 3 is a block diagram illustrating exemplary tests that may be performed by the electrical rules checking program of the preferred embodiment.

Reference is now made to FIG. 3, which is a block diagram that illustrates certain tests that may be executed by an electrical rules checker 100 in accordance with a preferred embodiment of the present invention. For example, one such test 102 may be to evaluate the P:N ratio for various static gates. Specifically, it may be desirable in certain situations to ensure that the PFET (P-Channel Field Effect Transistor) to NFET (N-Channel Field Effect Transistor) transistor width ratio is within a certain predefined range for certain circuit configurations. Another test 104 may be to evaluate a netlist file to detect series connected pass FETs, to ensure that an excessive number of pass FET-type gates are not series connected. Yet another test 106 may be to evaluate a netlist file to detect situations which may result in excessive cross-capacitor noise. Another test 108 may be to evaluate a netlist file to determine whether impermissible charge sharing is susceptible or likely to occur on a dynamic gate. Still another test may be to evaluate a netlist file to identify instances where series connected pass FETs may be subject to adverse charge sharing. Another test 112 may be to evaluate a netlist to identify dynamic gates having different clocks. Still another test 114 may be to evaluate a netlist file to identify a latch configuration having feedback that is either too big or too small. Still another test 116 may be to evaluate a netlist file to identify latch nodes that may be susceptible to alpha particles (i.e., ensure that a latch has at least a certain predefined capacitance). Still another test 118 may be to evaluate a netlist file to identify dynamic gates that do not have an evaluation FET. Still another test 120 may be to evaluate a netlist file to identify dynamic gates having feedback that is either too big or too small.

The foregoing lists only a few examples of a wide variety of tests which may be desired to be executed in connection with circuit design for integrated circuits. Since the present invention is directed to a system and method for controllably executing a plurality of tests, such as those listed above, a further description of the specific manner in which the tests are carried out is not necessary. In this regard, the present invention should not be viewed as limited by the tests performed, but rather the manner of controlling the execution of a plurality of tests.

Figure 4A:
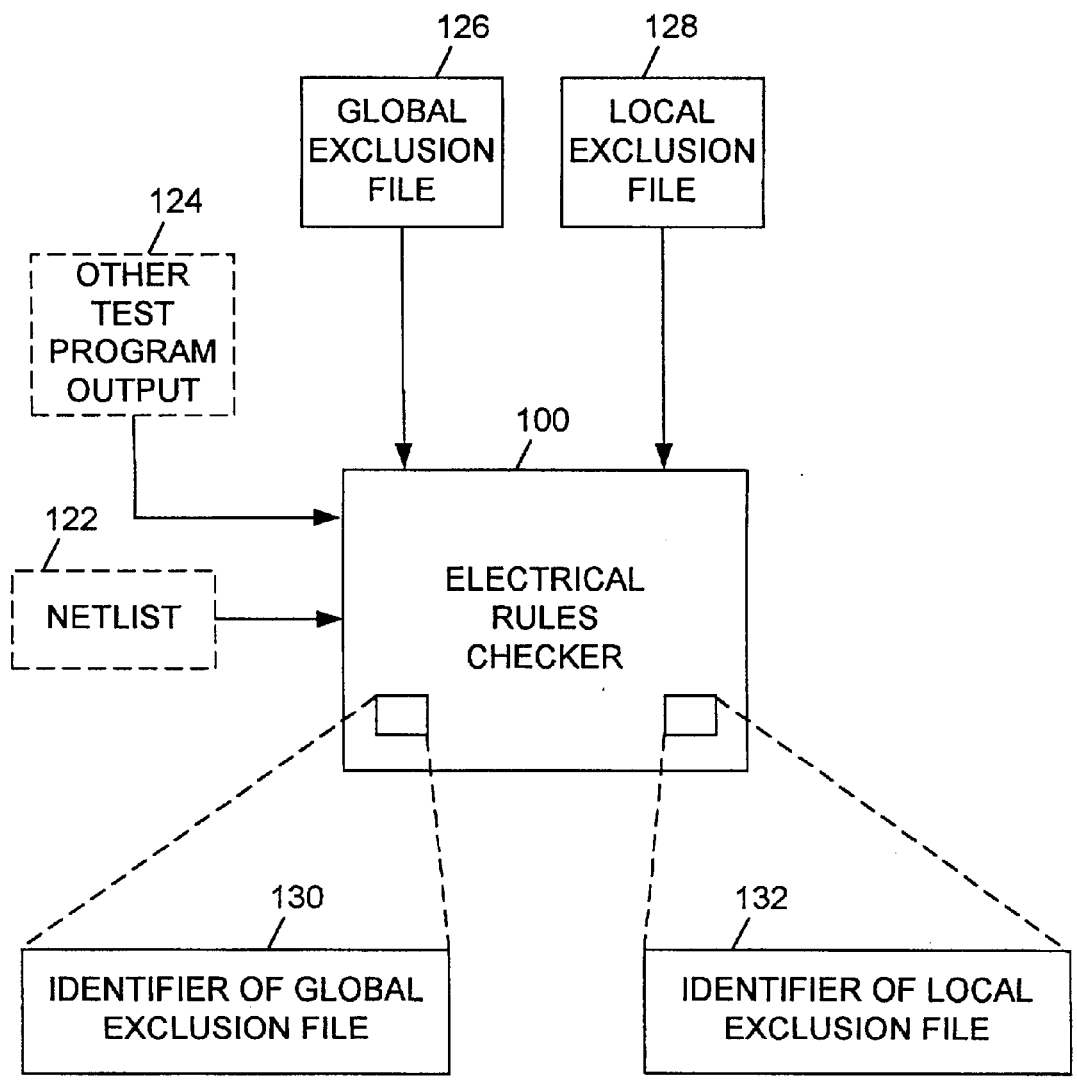
FIGS. 4A and 4B are block diagrams illustrating certain features of a system constructed in accordance with one aspect of the present invention.

Reference is now made to FIG. 4A, which is a block diagram illustrating certain features of a system constructed in accordance with one aspect of the present invention. The electrical rules checker 100, which is preferably a computer program or software routine, receives and operates on various input sources. The sources, which may be electronic files, may include a netlist 122 and an output 124 from another design test program, such as PathMill. In accordance with the preferred embodiment of the invention, the electrical rules checker program 100 also utilizes a global exclusion file 126 and a local exclusion file 128. Each of these files may simply contain a list of tests or routines that the electrical rules checker program 100 is otherwise configured to perform (e.g., the tests that are illustrated in FIG. 3). During operation, the electrical rules checker is configured to execute all of its predefined or preconfigured tests, except those that are listed in either the global exclusion file 126 or the local exclusion file 128. The global exclusion file 126 and a local exclusion file 128 will generally be located in different locations in a computer network or directory. It may include a predefined identifier 130 of a global exclusion file and a predefined identifier 132 for the local exclusion file. The term "identifier" is used generically here. It should be realized that, consistent with the invention, the identifier 130 of the global exclusion file may be a traditional DOS-type path name, as well as a logical IP address, path name for a file in a Unix-based system, a location identifier for a given computer network, a uniform resource locator (URL) (if a system of the invention is configured to operate across, for example, the Internet), or some other location identifier for the global exclusion file.

In operation, the electrical rules checker program 100 evaluates the identifier 130 of the global exclusion file, as well as the identifier of a local exclusion file. The electrical rules checker 100 then retrieves the contents of each of these files before beginning to execute the various tests in which the electrical checker 100 is configured to perform. Before executing any given tests, the electrical rules checker 100 may evaluate each of the exclusion files 126 and 128 to determine whether a given test is listed in either of the files. If so, it may omit the execution of that given test.

Figure 4B:
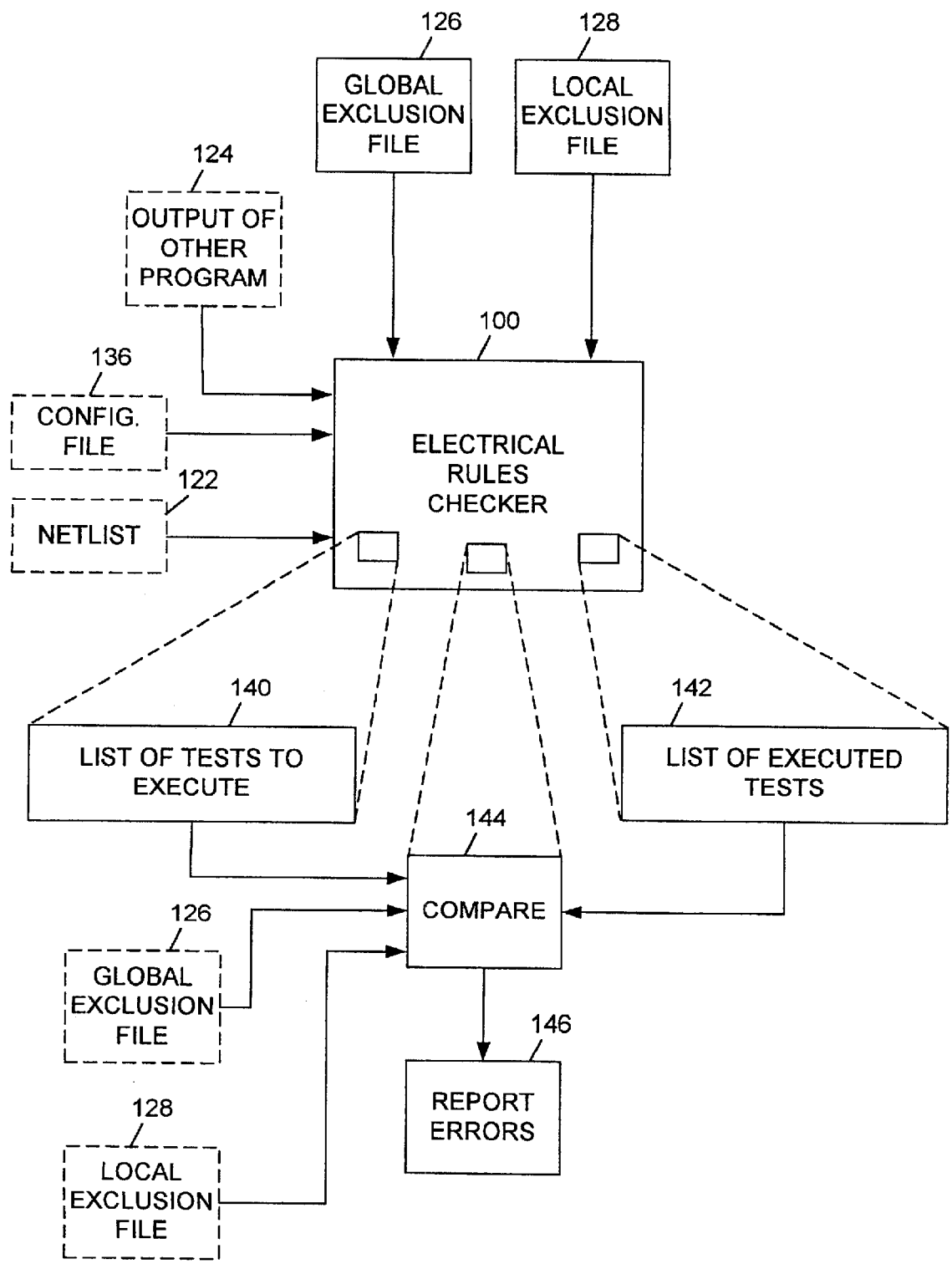

Reference is now made to FIG. 4B which is a block diagram similar to that illustrated in FIG. 4A. In addition to the elements listed in FIG. 4A, however, FIG. 4B also illustrates a configuration file 136, which may also be provided as an input to the electrical rules checker 100. In accordance with one embodiment of the invention, a configuration file 36 may be utilized to provide certain configuration information to the electrical rules checker 100. In this regard, the configuration file may contain the identifiers 130 and 132 for the global and local exclusion files. By providing this information to the electrical rules checker 100 in such a manner, the electrical rules checker 100 need not be changed or preconfigured to operate in different environments or to operate when the location of the global exclusion has been changed. Instead, such information may be provided by way of a configuration input.

FIG. 4B also illustrates a "back end" to the electrical rules checker 100 that operates as a double-check of the execution of the electrical rules checker 100, in accordance with one aspect of the invention. As will be better appreciated from the collective discussion of FIGS. 4B and 4C, this "back end" may be implemented in various ways and may take a variety of forms. In this regard, the electrical rules checker 100 may contain a listing of all the tests 140 that are to be executed in a given execution of the program. The electrical rules checker 100 may also contain a list 142 of tests that are actually executed during a given execution of the electrical rules checker program 100. In addition, the electrical rules checker 100 may include a code segment 144 that is configured to compare these two lists of tests.

More particularly, the electrical rules checker may, during the execution of each test, add each test to a list 142 of tests that are actually executed, as each test is executed by the electrical rules checker 100. Generally, and assuming that certain tests are excluded by either the local exclusion file 128 or the global exclusion file 126, the list 142 of tests that are actually executed should be smaller than the list 140 of tests that the electrical rules checker 100 is configured to execute. An interim differential list (not shown) may be generated in this comparison process. This interim list may then be compared to the global exclusion file 126 and the local exclusion file 128. Every test of this interim list should be listed in either one or the other of the exclusion files 126 and 128. If so, then the system has properly excluded those tests that were to be excluded from that execution of the electrical rules checker 100. If not, then the system may assume that an error has been encountered, and it may generate an error report 146 that may be provided to the user. The error report may simply report those tests that should have been executed, but were not.

Figure 4C:
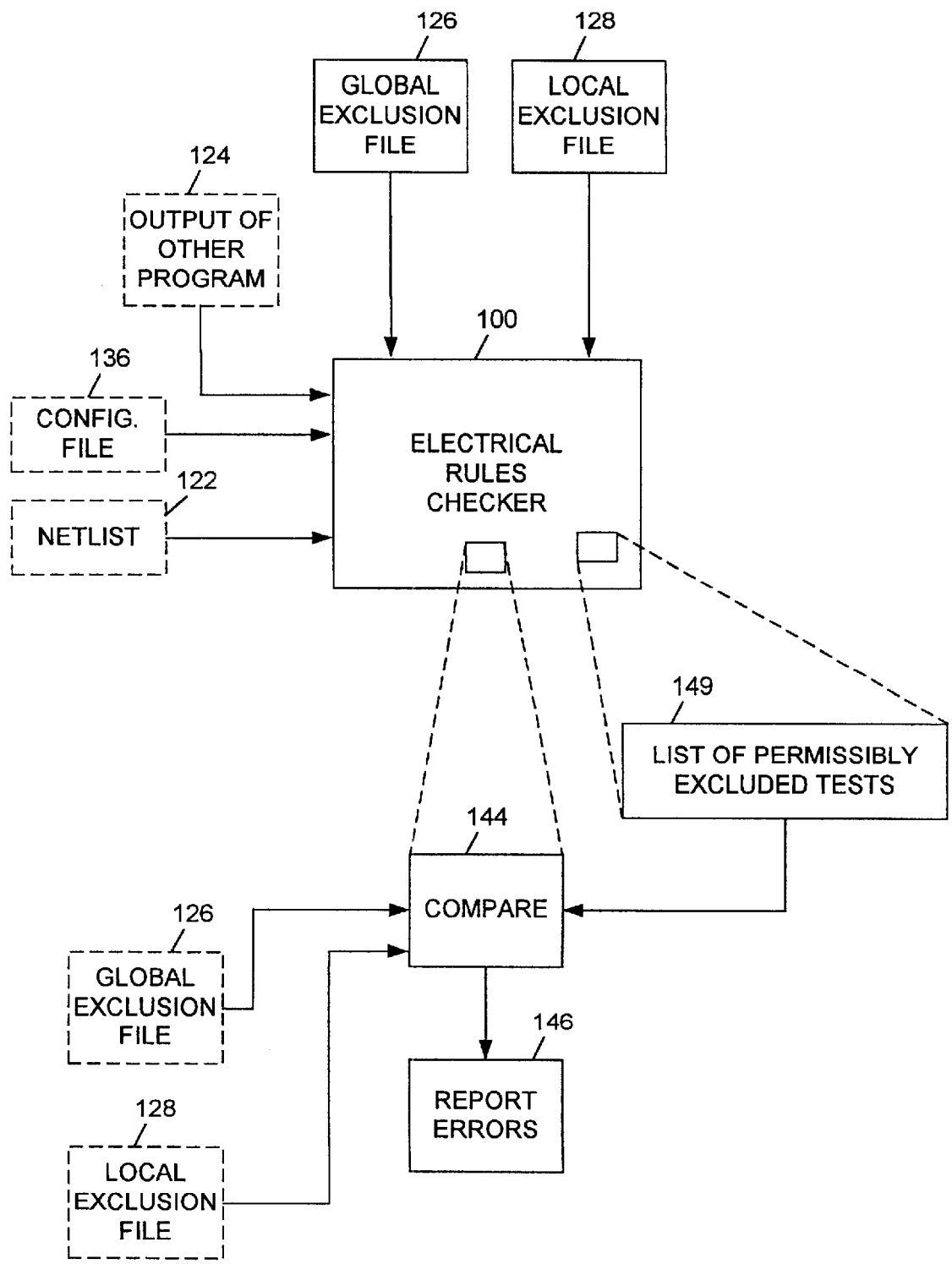
FIG. 4C is a block diagram similar to FIG. 4B, but illustrating an alternative embodiment of the invention.

Reference is now made to FIG. 4C, which shows a similar, but alternative, implementation of the "back end." This embodiment differs from that illustrated in FIG. 4B in that in includes an addition file 149. Further, it does not include the list of tests to execute 140, nor does it include the list of executed tests 142. Instead, the comparison module 144 may be configured to compare the collective list of tests in the global exclusion file 126 and the local exclusion file 128 with the list of permissibly excluded tests 149. For a given project, there may be many tests that must be run on a circuit design, and all others (which may be optionally run, or excluded) may be listed in a separate file 149. The back end may compare the tests collectively excluded by the global exclusion file 126 and the local exclusion file 128 against those files which may permissibly be excluded. If there are tests listed in either the global exclusion file 126 or the local exclusion file 128, which are not also listed in the file 149, then the back end may conclude that one or more tests was not executed that should have been, and the comparison module 144 may generate an appropriate error report 146.

Figure 5:
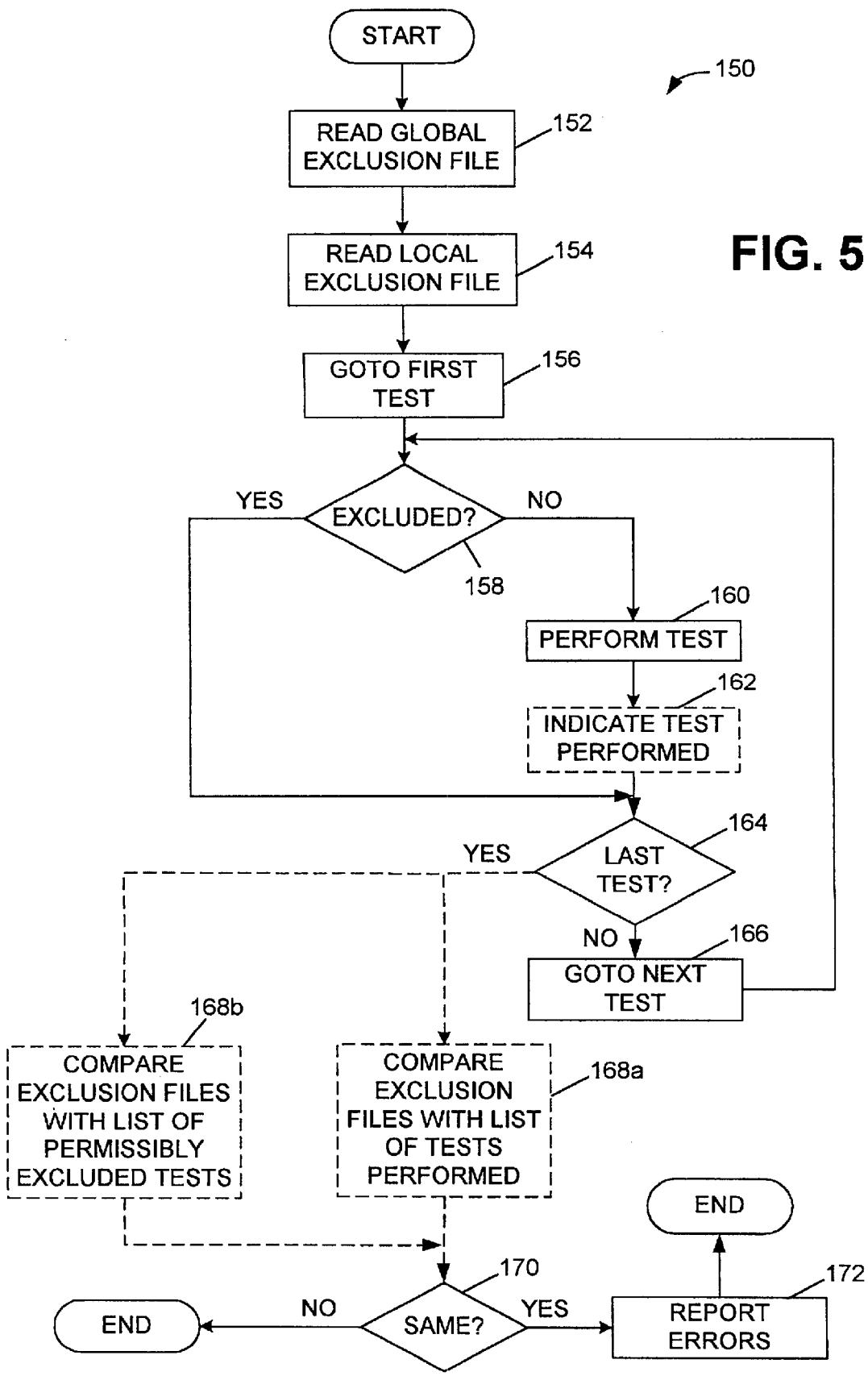
FIG. 5 is a flowchart illustrating the top-level functional operation of a system constructed in accordance with one aspect of the present invention.

Reference is now made to FIG. 5, which is a flow chart 150 that illustrates the top-level functional operation of a system constructed in accordance with one aspect of the present invention. In accordance with this aspect, the electrical rules checker program 100 may begin by retrieving the contents of the global exclusion file (step 152). In similar fashion, it may retrieve the contents of a local exclusion file (step 154). The program may then proceed to a first test that is to be executed by the electrical rules checker (step 156). The system may then evaluate the first test, as compared to those tests listed in the global exclusion file and the local exclusion file, to determine whether the test should be excluded (step 158). If not the system performs the test (step 160), and may indicate that the test has been performed (step 162). As should be appreciated from the description provided herein, step 162 is optional, and may not be implemented in some embodiments of the invention. For this reason, the step has been illustrated in dashed line. In this regard, the system may generate a separate file, in which it may list each test that is executed is listed. This file may be used by the back-end of the electrical rules checker 100, as described in connection with FIG. 4B. The system may then perform an evaluation to determine whether this is the last step to be executed (step 164). If not, the system proceeds to the next step that is to be executed (step 166), and then returns to repeat the steps listed above, beginning with step 158.

If, however, the step was the last step, then the system may proceed to the back-end routine. As previously described, there are various ways of implementing the back end routine, consistent with the invention. In one embodiment, the system may compare the contents of both exclusion files with a list of tests that were performed (step 168*a*). This list of tests performed may be the list generated by step 162. It will be appreciated that none of the tests listed in the exclusion files should be also listed in the list of tests performed. In an alternative embodiment, the system may compare the tests listed in the local and global exclusion files with tests listed in a file that lists tests which may be permissibly excluded (step 168*b*). Therefore, an evaluation may be made (step 170) to determine whether any test within the exclusion files is the same as any test listed in the list of tests performed (or whether the tests listed within the exclusion files are also listed in a file of permissibly excluded tests). If not, it may be assumed that the electrical rules checker program 100 executed appropriately. If, however, any tests are the same in the two listings, then the system may generate an error report, listing those tests that were inappropriately executed (step 172).

Figure 6:
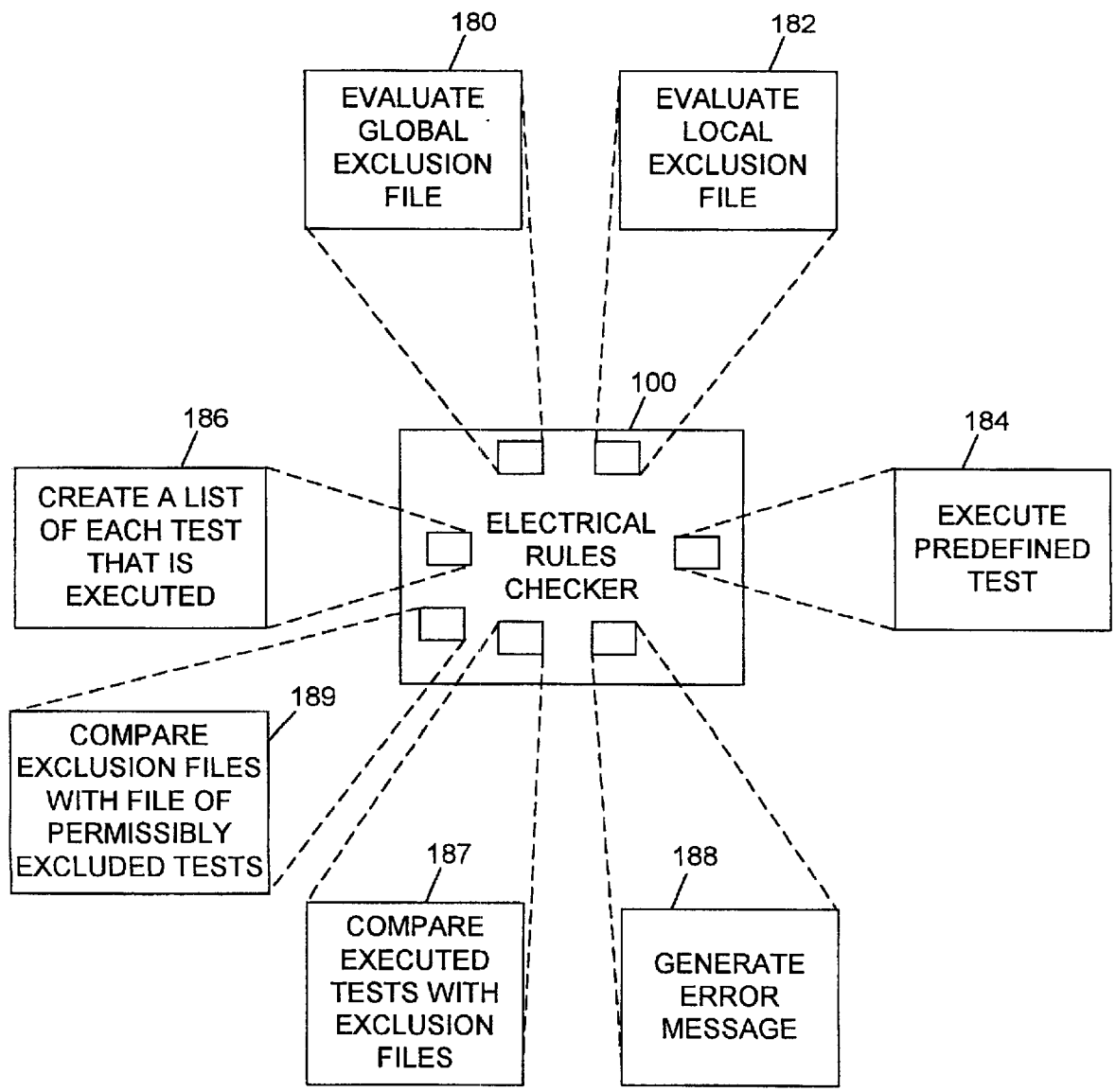
FIG. 6 is a block diagram illustrating various code segments that may be implemented in a computer readable storage medium constructed in accordance with one aspect of the present invention.

Finally, reference is made to FIG. 6, which is a block diagram that illustrates various code segments or routines that may be provided in connection with a system constructed in accordance with the invention. In this regard, in accordance with one aspect of the invention, the electrical rules checker program 100 may be provided in a form of a computer readable storage medium that contains a plurality of code segments that operate to execute various routines or carry out various functions in accordance with one aspect of the invention. In this respect, a first segment 180 may be provided that controls the electrical rules checker 100 to evaluate a global exclusion file. A second segment 182 may be provided to control the operation of the electrical rules checker 100 to evaluate a local exclusion file. The third segment 184 may be provided to control the execution of a plurality of predefined tests. As a part of this segment's controlled execution of the predefined tests, the segment may exclude those tests that are listed in either the global exclusion file or the local exclusion file. A fourth segment 186 may be provided to create a list of each test that is executed during the execution phase of the electrical rules checker 100. Another segment 187 may be provided to compare the executed tests with those tests listed in the two exclusion files. This segment may be configured so that any test executed, and also listed in the exclusion file, may result in the generation of an error. In this regard, a sixth segment 188 may be provided to controllably generate an error message in response to the comparison made by the fifth segment 187. Finally, a seventh segment 189 may be provided to compare the tests listed in the local and global exclusion files with a list of tests that may be permissibly excluded.

It should be appreciated that the flow chart of FIG. 5 shows the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIG. 5. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for performing design tests on a circuit design comprising the steps of:
    (a) evaluating a first file that identifies at least one test;
    (b) evaluating a second file that identifies at least one test;
    (c) executing a plurality of predefined tests, excluding all tests that are identified in the first file and all tests identified in the second file;
    (d) creating a list of executed tests; and
    (e) adding to the list of executed tests every executed test in response to the execution of each test.

2. The method as defined in claim 1, further including the step of comparing the list of executed tests, after all tests have been executed, to the tests listed in both the first and second files.

3. The method as defined in claim 2, further including the step of reporting an error if any test listed in the list of executed tests is also listed in either the first or second file.

4. A method for performing design tests on a circuit design comprising the steps of:
    (a) evaluating a first file that identifies at least one test;
    (b) evaluating a second file that identifies at least one test;
    (c) evaluating a third file that lists a plurality of tests to be permissibly excluded;
    (c) executing a plurality of predefined tests, excluding tests that are identified in the first file and tests identified in the second file; and
    (d) comparing the at least one test in the first file and the at least one test in the second file with the plurality of tests in the third file, to ensure that all tests listed in the first and second files are also listed in the third file.

5. A computer readable storage medium containing program code for performing design tests on a circuit design comprising:
    a first code segment configured to evaluate a first file that identifies at least one test;
    a second code segment configured to evaluate a second file that identifies at least one test; and
    a third code segment configured to execute a plurality of predefined tests, excluding tests that are identified in the first file and tests identified in the second file.

6. The system as defined in claim 5, further including a fourth code segment configured to create a list of each test that is executed by the third code segment.

7. The system as defined in claim 6, further including a fifth code segment configured to compare the tests listed in the list of each test against the tests identified in the first file and the tests identified in the second file.

8. The system as defined in claim 7, further including sixth code segment configured to generate an error message if any of the tests listed in the list of each test is listed in either the first file or the second file.

9. A system for performing design tests on a circuit design comprising:
    a first file stored at a first location, the first file identifying at least one test;
    a second file stored at a second location, the second file identifying at least one test;
    means for executing a plurality of predefined tests, excluding tests that are identified in the first file and tests identified the second file, wherein the means for executing the plurality of tests is configured to execute all tests identified in the first file and all tests identified in the second file.

10. The system as defined in claim 9, further including means for creating a list of each test that is executed by the means for executing the plurality of tests.

11. The system as defined in claim 10, further including means for comparing the tests listed in the list of each test against the tests identified in the first file and the tests identified in the second file.

12. The system as defined in claim 11, further including means for generating an error message if any of the tests listed in the list of each test is listed in either the first file or the second file.

* * * * *